(12) United States Patent
Wang

(10) Patent No.: US 9,489,896 B2
(45) Date of Patent: Nov. 8, 2016

(54) GATE DRIVING CIRCUIT AND GATE DRIVING METHOD, GATE DRIVER ON ARRAY (GOA) AND DISPLAY DEVICE

(71) Applicant: BOE TECHNOLOGY GROUP CO., LTD., Beijing (CN)

(72) Inventor: Ying Wang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 6 days.

(21) Appl. No.: 14/435,645

(22) PCT Filed: Sep. 5, 2014

(86) PCT No.: PCT/CN2014/086024
§ 371 (c)(1),
(2) Date: Apr. 14, 2015

(87) PCT Pub. No.: WO2015/158101
PCT Pub. Date: Oct. 22, 2015

(65) Prior Publication Data
US 2016/0148568 A1 May 26, 2016

(30) Foreign Application Priority Data

Apr. 17, 2014 (CN) .......................... 2014 1 0155269

(51) Int. Cl.
*G09G 3/32* (2016.01)
(52) U.S. Cl.
CPC .............. *G09G 3/3266* (2013.01); *G09G 3/32* (2013.01); *G09G 3/3258* (2013.01); *G09G 2300/0426* (2013.01); *G09G 2300/0819* (2013.01); *G09G 2310/0286* (2013.01); *G09G 2310/08* (2013.01); *G09G 2330/021* (2013.01)
(58) Field of Classification Search
CPC .................. G09G 2310/0286; G09G 3/3266; G09G 3/3677; G09G 2310/0283; G09G 3/3688; G09G 3/3674; G09G 2300/0408; G09G 2310/061; G11C 19/184; G11C 7/1051; G11C 7/1057; H03K 19/096; H03K 19/01714; H03K 19/01735; H03K 4/24
See application file for complete search history.

(56) References Cited

U.S. PATENT DOCUMENTS

| 9,325,311 B1* | 4/2016 | Konoshita ............ H03K 17/687 |
| 2005/0008114 A1* | 1/2005 | Moon .................. G09G 3/3677 377/64 |

(Continued)

FOREIGN PATENT DOCUMENTS

| CN | 101377956 A | 3/2009 |
| CN | 101388197 A | 3/2009 |

(Continued)

OTHER PUBLICATIONS

Office Action in Chinese Patent Application No. 201410155269.7, dated Apr. 28, 2016.

(Continued)

*Primary Examiner* — Sanjiv D Patel
(74) *Attorney, Agent, or Firm* — Bakerhostetler LLP

(57) ABSTRACT

The present disclosure provides a gate driving circuit which can be applied in a display panel. The gate driving circuit may include a driving signal output unit, provided with a storage capacitor; a driving control unit, configured to sample an input signal in a first period of each scanning cycle, control the driving signal output unit to output a first gate driving signal which is configured to turn on thin film transistors (TFTs) in a display panel in a second period of each scanning cycle, and control the driving signal output unit to output a second gate driving signal which is configured to turn off the TFTs in the display panel by using the storage capacitor across which a voltage difference is within a predetermined range in a third period of each scanning cycle; and a compensating unit, configured to maintain the voltage difference across the storage capacitor to be within the predetermined range in the third period of each scanning cycle.

16 Claims, 4 Drawing Sheets

(56) References Cited

U.S. PATENT DOCUMENTS

| | | | |
|---|---|---|---|
| 2009/0122951 A1 | 5/2009 | Tobita | |
| 2009/0303211 A1* | 12/2009 | Hu | G11C 19/28 345/204 |
| 2012/0256817 A1* | 10/2012 | Chen | G11C 19/28 345/92 |
| 2014/0071108 A1 | 3/2014 | Han | |

FOREIGN PATENT DOCUMENTS

| | | | |
|---|---|---|---|
| CN | 102346999 A | | 2/2012 |
| CN | 102651186 A | | 8/2012 |
| CN | 102831860 A | * | 12/2012 |
| CN | 102930812 A | | 2/2013 |
| CN | 103165190 A | | 6/2013 |
| CN | 103956137 A | | 7/2014 |
| CN | 203773912 U | | 8/2014 |

OTHER PUBLICATIONS

International Search Report and Written Opinion in PCT International Application No. PCT/CN2014/086024, dated Jan. 21, 2015.
Office Action in Chinese Patent Application No. 201410155269.7, dated Jan. 8, 2015.
Office Action in Chinese Patent Application No. 201410155269.7, dated Jun. 29, 2015.

* cited by examiner

GATE DRIVING CIRCUIT AND GATE DRIVING METHOD, GATE DRIVER ON ARRAY (GOA) AND DISPLAY DEVICE

CROSS-REFERENCE TO RELATED APPLICATION

This application is the U.S. National Phase of International Patent Application No. PCT/CN2014/086024, filed Sep. 5, 2014 and claims priority to Chinese Patent Application No. 201410155269.7 filed on Apr. 17, 2014, the disclosures of which are incorporated in their entirety by reference herein.

TECHNICAL FIELD

The present disclosure relates to the field of display technology, in particular to a gate driving circuit and a gate driving method, a Gate Driver on Array (GOA) and a display device.

BACKGROUND

Typically, a Gate Driver on Array (GOA) applied in active matrix organic light emitting diode (AMOLED) display device is mainly used to generate gate signals (selection signals) for pixel circuits. The GOA is formed by multi-level gate driving circuits connected in series, so that the design of the gate driving circuit directly adverse effects performance of the gate driving signal. For a backplane circuit using low-temperature polysilicon technology, a leakage current problem in a low-temperature polysilicon transistor needs to be solved. Therefore, with respect to a GOA, it is an important consideration in the circuit design to ensure the voltages of critical nodes, so as to suppress the possible leakage current in the critical path(s).

SUMMARY

Technical Problems to be Solved

An object of the present disclosure is to provide a gate driving circuit and a gate driving method, a Gate Driver on Array (GOA) and a display device, so as to suppress a leakage current being generated in a critical path(s) in a gate driving circuit.

Technical Solutions

In order to achieve the above object, the present disclosure provides a gate driving circuit, including: a driving signal output unit, provided with a storage capacitor; a driving control unit, configured to sample an input signal in a first period of each scanning cycle, control the driving signal output unit to output a first gate driving signal which is configured to turn on thin film transistors (TFTs) in a display panel in a second period of each scanning cycle, and control the driving signal output unit to output a second gate driving signal which is configured to turn off the TFTs in the display panel by using the storage capacitor across which a voltage difference is within a predetermined range in a third period of each scanning cycle; and a compensating unit, configured to maintain the voltage difference across the storage capacitor to be within the predetermined range in the third period of each scanning cycle.

Alternatively, the first gate driving signal and the second gate driving signal may be outputted by a gate driving signal output end.

Alternatively, the driving control unit may be connected to the driving signal output unit via a first node and a second node.

Alternatively, the storage capacitor may be connected between the first node and the gate driving signal output end.

Alternatively, the driving signal output unit may further include: a first output transistor, a gate electrode of which is connected to the first node, a first electrode of which is connected to a first signal output end, and a second electrode of which is connected to the gate driving signal output end; and a second output transistor, a gate electrode of which is connected to the second node, a first electrode of which is connected to the gate driving signal output end, and a second electrode of which is connected to a second signal output end.

Alternatively, the compensating unit may include: a first compensating transistor, a gate electrode of which is inputted with a control signal, and a first electrode of which is connected to the gate driving signal output end; and a second compensating transistor, a gate electrode of which is connected to the gate driving signal output end, a first electrode of which is connected to a second electrode of the first compensating transistor, and a second electrode of which is connected to the first node.

Alternatively, the control signal may control the first compensating transistor to be turned on in the third period of each scanning cycle, or the control signal may control the first compensating transistor to be turned on at a predetermined interval in the third period of each scanning cycle.

Alternatively, the driving control unit may include: an input transistor, a gate electrode of which is inputted with a first clock signal, a first electrode of which is inputted with the input signal, and a second electrode of which is connected to the first node; a first driving control transistor, a gate electrode and a first electrode of which are inputted with the first clock signal, and a second electrode of which is connected to the second node; and a second driving control transistor, a gate electrode of which is connected to the first node, a first electrode of which is connected to the second node, and a second electrode of which is inputted with the first clock signal.

Alternatively, the gate driving circuit may further include: a potential maintaining capacitor, connected between the second node and the second signal output end, and configured to maintain a potential of the second node in the third period of each scanning cycle.

Alternatively, both the first output transistor and the second output transistor may be P-type thin film transistors (TFTs).

The present disclosure further provides in an embodiment a gate driving method, applied in the above gate driving circuit. The gate driving method includes: sampling, by a driving control unit, an input signal in a first period of each scanning cycle; controlling, by the driving control unit, a driving signal output unit to output a first gate driving signal which is configured to turn on thin film transistors (TFTs) in a display panel in a second period of each scanning cycle; and controlling, by the driving control unit, the driving signal output unit to output a second gate driving signal which is configured to turn off the TFTs in the display panel by using a storage capacitor across which a voltage difference is within a predetermined range in a third period of each scanning cycle.

The gate driving method may further include: maintaining, by a compensating unit, the voltage difference across the storage capacitor to be within the predetermined range in the third period of each scanning cycle.

The present disclosure further provides in an embodiment a gate driver on array (GOA), including multi-level gate driving circuits described above; wherein except for a first level gate driving circuit, an input end of each of the multi-level gate driving circuits which is configured to receive an input signal is connected to a gate driving signal output end of an immediately previous level gate driving circuit.

The present disclosure further provides in an embodiment a display device, including the above gate driver on array (GOA).

Alternatively, the display device may be an active matrix organic light emitting diode (AMOLED) display device.

Beneficial Effects

Embodiments of the present disclosure at least have the following beneficial effects.

Compared to the related art, in the gate driving circuit and gate driving method, the GOA and the display device according to the present disclosure, the compensating unit is used, so that the voltage difference across the storage capacitor is maintained to be within a predetermined range in the third period of each scanning cycle. And therefore, the driving signal output unit outputs the second gate driving signal configured to turn off the TFTs in the display panel, thereby reducing the adverse effects of the leakage current.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

Embodiments of the present disclosure will be further described below in conjunction with the accompanying drawings and examples. The following embodiments are merely used to illustrate the present disclosure, but not intended to limit the scope of the present invention.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly.

First Embodiment

Figure 1:
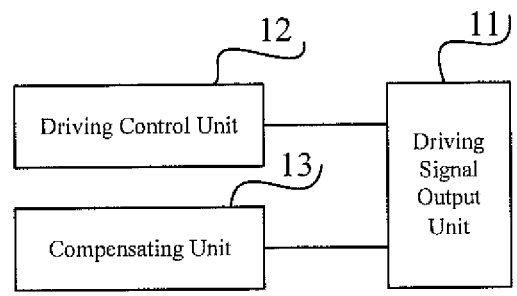
FIG. 1 is a block diagram showing a structure of a gate driving circuit according to a first embodiment of the present disclosure.

As shown in FIG. 1, the present disclosure provides in a first embodiment a gate driving circuit. The gate driving circuit includes:

a driving signal output unit 11, provided with a storage capacitor (not shown in FIG. 1);

a driving control unit 12, configured to sample an input signal in a first period of each scanning cycle, control the driving signal output unit 11 to output a first gate driving signal which is configured to turn on thin film transistors (TFTs) in a display panel in a second period of each scanning cycle, and control the driving signal output unit 11 to output a second gate driving signal which is configured to turn off the TFTs in the display panel by using the storage capacitor across which a voltage difference is within a predetermined range in a third period of each scanning cycle; and a compensating unit 13, configured to maintain the voltage difference across the storage capacitor to be within the predetermined range in the third period of each scanning cycle, so that the driving signal output unit 11 keeps on outputting the second gate driving signal which is configured to turn off the TFTs in the display panel. Here, the predetermined range within which the voltage difference across the storage capacitor is can be set as needed by a person skilled in the art, to reasonably reduce the impact of leakage current, specific values of which will not be limited in the present disclosure.

The compensating unit 13 is used in the gate driving circuit according to the first embodiment of the present disclosure, so that the voltage difference across the storage capacitor is maintained to be within a predetermined range in the third period of each scanning cycle. And therefore, the driving signal output unit 11 outputs the second gate driving signal configured to turn off the TFTs in the display panel, thereby reducing the effects of the leakage current.

In an embodiment of the present disclosure, the first period is an input sampling period, the second period is an outputting period, and the third period includes a reset period in each scanning cycle as well as a time period between the reset period in each scanning cycle and an input sampling period in a next scanning cycle. Since no compensating unit is used in the related art, a case that the TFTs in the display panel cannot be ensured to be turned off by the second gate driving signal in the third period will occur due to the leakage current. To this end, in the embodiment of the present disclosure, the compensating unit is provided so as to avoid adverse effects caused by the leakage current.

The transistors used in all embodiments of the present disclosure may be thin film transistors or field effect transistors or other devices having same characteristics. In order to distinguish two electrodes other than a gate electrode of a transistor, one of the two electrodes is referred as a source electrode, and the other is referred as a drain electrode. In addition, transistors can be divided into an n-type transistor or a p-type transistor based on the characteristic of a transistor. In the driving circuit according to an embodiment of the present disclosure, that either an n-type transistor or a p-type transistor is used is easily conceivable for a person skilled in the art without creative work, and therefore it falls within the protection scope of the present disclosure.

In the driving circuit according to an embodiment of the present disclosure, a first electrode of an n-type transistor may be a source electrode, and a second electrode of the n-type transistor may be a drain electrode; a first electrode of a p-type transistor may be a drain electrode and a second electrode of the p-type transistor may be a source electrode.

Second Embodiment

The gate driving circuit according to the second embodiment of the present disclosure is based on that according to the first embodiment. Specifically, as shown in FIG. 2, in the gate driving circuit according to the second embodiment, the first gate driving signal and the second gate driving signal are outputted by a gate driving signal output end G[n]; the driving control unit 12 is connected to the driving signal output unit 11 via a first node N1 and a second node N2.

The driving signal output unit 11 includes:
a storage capacitor C1, which is connected between the first node N1 and the gate driving signal output end G[n];
a first output transistor T1, a gate electrode of which is connected to the first node N1, a first electrode of which is connected to a first signal output end V1, and a second electrode of which is connected to the gate driving signal output end G[n]; and
a second output transistor T2, a gate electrode of which is connected to a second node N2, a first electrode of which is connected to the gate driving signal output end G[n], and a second electrode of which is connected to a second signal output end V2.

Figure 2:
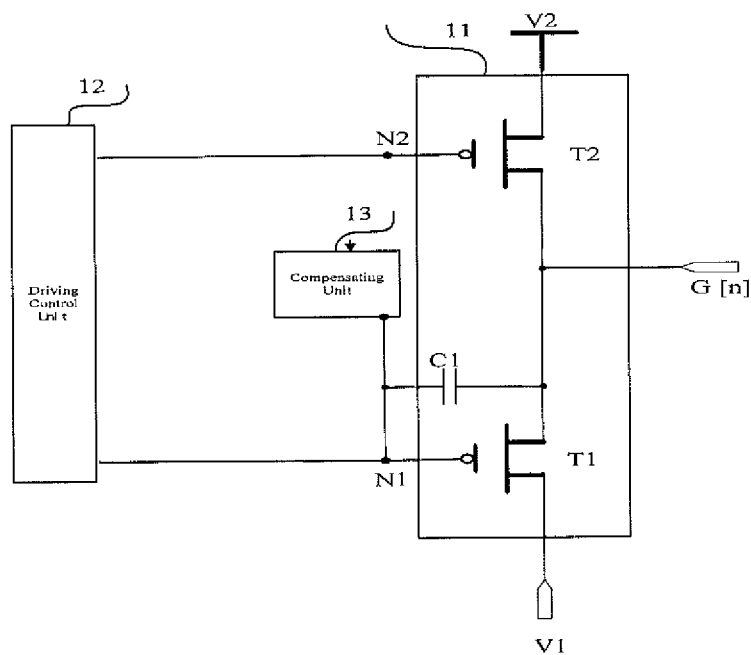
FIG. 2 is a diagram showing a structure of a gate driving circuit according to a second embodiment of the present disclosure.

As shown in FIG. 2, in the gate driving circuit according to this embodiment, both T1 and T2 are p-type TFTs.

Third Embodiment

The gate driving circuit according to the third embodiment of the present disclosure is based on that according to the second embodiment. In this embodiment, as shown in FIG. 3, the compensating unit 13 includes:
a first compensating transistor TC1, a gate electrode of which is inputted with a control signal Ctrl, and a first electrode of which is connected to the gate driving signal output end G[n]; and
a second compensating transistor TC2, a gate electrode of which is connected to the gate driving signal output end G[n], a first electrode of which is connected to a second electrode of the first compensating transistor TC1, and a second electrode of which is connected to the first node N1.

Here, the control signal Ctrl controls the first compensating transistor TC1 to be turned on in the third period of each scanning cycle; or, the control signal Ctrl controls the first compensating transistor TC1 to be turned on at a predetermined interval in the third period of each scanning cycle.

Figure 3:
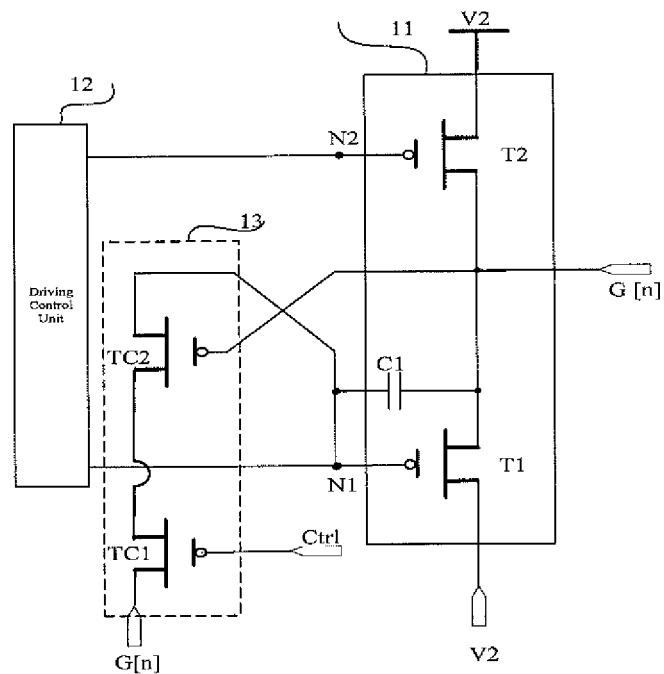
FIG. 3 is a diagram showing a structure of a gate driving circuit according to a third embodiment of the present disclosure.

When the gate driving circuit as shown in FIG. 3 is working, a unidirectional anti-shake of the gate driving signal outputted by G[n] in the third period of each scanning cycle can be achieved by TC1 and TC2.

Fourth Embodiment

The gate driving circuit according to the fourth embodiment of the present disclosure is based on that according to the third embodiment. In this embodiment, as shown in FIG. 4, the driving control unit includes:
an input transistor TI, a gate electrode of which is inputted with a first clock signal CLK, a first electrode of which is inputted with the input signal, and a second electrode of which is connected to the first node N1; wherein the input signal is inputted by an input end INPUT;
a first driving control transistor TD1, a gate electrode and a first electrode of which are inputted with the first clock signal CLK, and a second electrode of which is connected to the second node; and
a second driving control transistor TD2, a gate electrode of which is connected to the first node N1, a first electrode of which is connected to the second node N2, and a second electrode is inputted with the first clock signal CLK.

Figure 4:
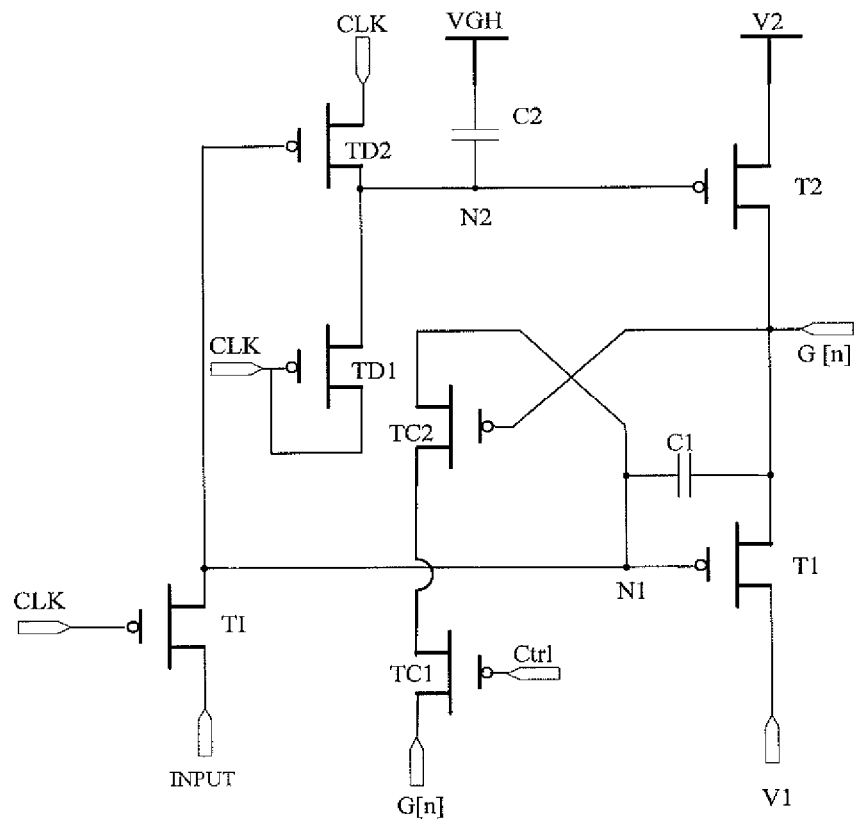
FIG. 4 is a circuit diagram showing a gate driving circuit according to a fourth embodiment of the present disclosure.

Alternatively, as shown in FIG. 4, in this embodiment the gate driving circuit may further include:
a potential maintaining capacitor C2, which is connected between the second node N2 and the second signal output end V2 and configured to maintain a potential of the second node N2 in the third period of each scanning cycle.

Fifth Embodiment

Figure 5:
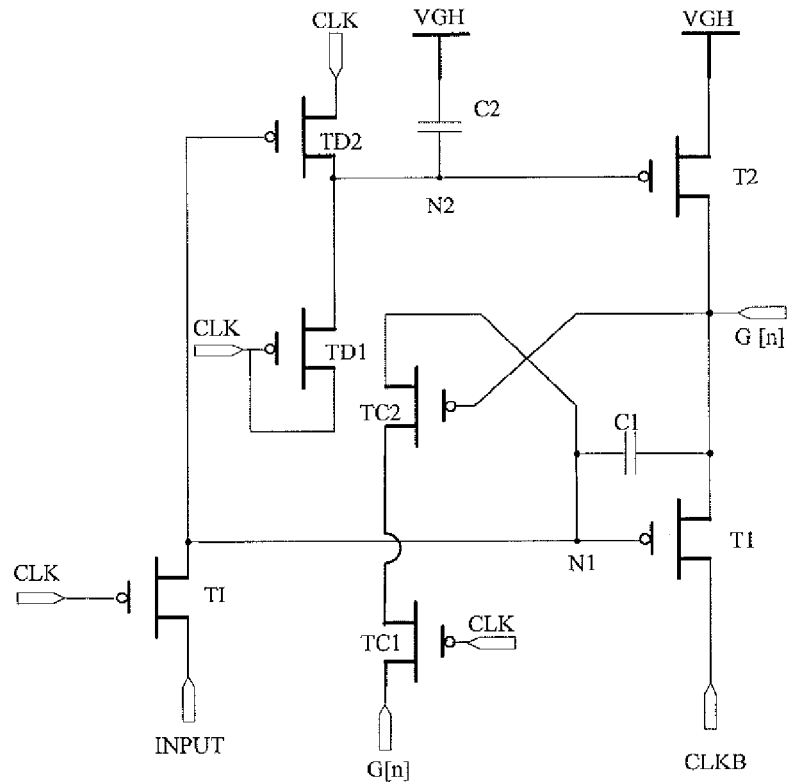
FIG. 5 is a circuit diagram showing a gate driving circuit according to a fifth embodiment of the present disclosure.

The gate driving circuit according to the fifth embodiment of the present disclosure is based on that according to the fourth embodiment. In this embodiment, as shown in FIG. 5, the first signal output end V1 outputs a second clock signal CLKB.

The second clock signal CLKB and the first clock signal CLK are inverted.

The second signal output end V2 outputs a high level VGH.

The control signal Ctrl is the first clock signal CLK.

The input end INPUT is connected to a gate driving signal output end G[n−1] of an immediately previous level gate driving circuit.

Figure 6:
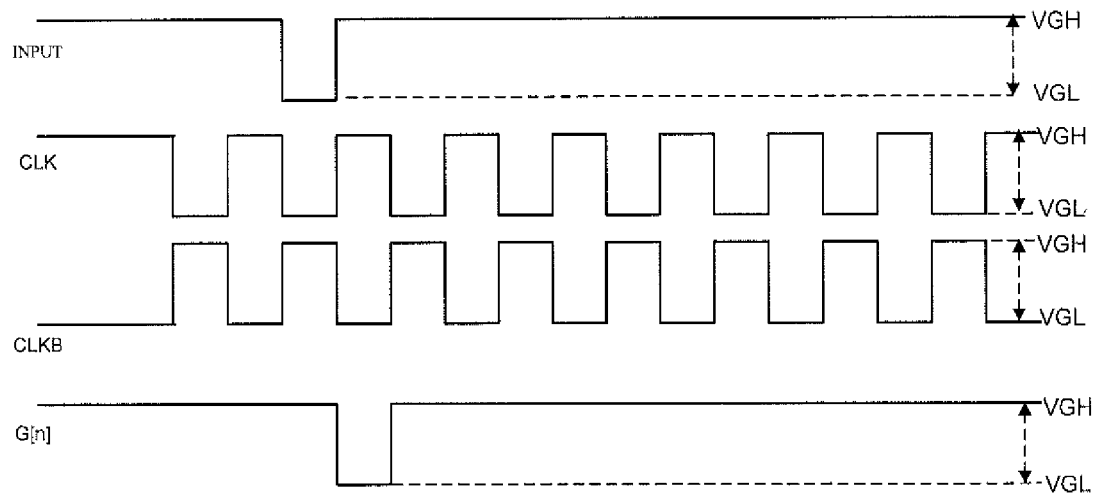
FIG. 6 is a timing chart for the gate driving circuit according to the fifth embodiment of the present disclosure.

FIG. 6 is a timing chart for the gate driving circuit according to the fifth embodiment of the present disclosure.

As shown in FIG. 6, during the input sampling period, the INPUT outputs a low level; CLK is a low level signal, a potential value of which is VGL; CLKB is a high level signal, a potential value of which is VGH; therefore, the input transistor TI is turned on. At this time, the potential of node N1 is pulled down to VGL+|Vthp| (Vthp is a threshold voltage of the p-type TFT) accordingly. And at the same time, both TD1 and TD2 are turned on, the potential of the node N2 is at a low level, therefore T2 is turned on, and G[n] outputs a high level VGH. Since the potential of the node N1 is at a low level, T1 is turned on. Since CLKB is also a high level signal, it is ensured that G[n] outputs a high level. At this time, C1 is charged and the input signal is sampled, and the voltage difference across C1 is VGH−VGL−|Vthp|.

During the output period, the INPUT outputs a low level VGL; CLK is a high level signal, a potential value of which is VGH. Due to the bootstrap effect of the storage capacitor C1, the potential of the node N1 is pulled down to 2VGL+

|Vthp| by TI. As a result, T2 is turned on. In addition, CLKB is a low level signal, a potential value of which is VGL, and then G[n] outputs a low level VGL. At this time, the node N1 is at a low level, which ensures that TD2 is turned on. Therefore, the node N2 is reset to be at a high level, T2 is turned off, which will not affect the output G[n]. During the reset period and a period after the reset period in this scanning cycle (that is, a period between the reset period and another period when the INPUT becomes a low level signal a next time), CLK is a low level signal, a potential value of which is VGL; T2 is turned on; INPUT is a high level signal. Accordingly, the potential of the node N1 is pulled up to a high level, and then TD2 is turned off. At this time, since CLK is a low level signal, TD1 is turned on and the potential of the node N2 is pulled down. As a result, T2 is turned on and the gate driving signal outputted by G[n] is pulled up to a high level again, thereby to reset the output. During this period, C2 maintains the potential of the node N2 to be at a low level. Therefore, it is ensured that T1 is turned on; the gate driving signal outputted by G[n] is maintained to be at a high level; the stability of the gate driving signal is improved, A unidirectional anti-shake of the gate driving signal outputted by G[n] can be achieved by TC1 and TC2.

A specific implementation of the unidirectional anti-shake of the gate driving signal outputted by G[n] achieved by TC1 and TC2 may be as follows. During the reset period and a period after the reset period in the scanning cycle, if the gate driving signal outputted by G[n] cannot be maintained to be at a high level VGH due to the leakage current via the node N1, then with respect to TC1, the gate-source voltage difference of TC1, Vgs(TC1)=V(CLK)−V(G[n]). When the potential of CLK is at a low level, a case that TC1 is turned on is likely to occur. The potential of the drain electrode, Vd (TC1)=G[n]', where G[n]' has a delay with respect to G[n]. At this time, the gate electrode and the source electrode of TD1 are connected to G[n] and G[n]' respectively. Then the transistor TD1 may also be turned on, As a result, a high level signal is rewritten to the node N1, and therefore the state of T1 is refreshed and the effect of the leakage current is reduced. In order to increase the sensitivity of the circuit, the channel width/length ratios of the transistors TD1 and TD2 need to be accurately designed with calculating to ensure that the threshold voltages of TD1 and TD2 are small.

The present disclosure further provides in an embodiment a gate driving method, applied in the above gate driving circuit, The gate driving method may include: sampling, by a driving control unit, an input signal in a first period of each scanning cycle; controlling, by the driving control unit, a driving signal output unit to output a first gate driving signal which is configured to turn on thin film transistors (TFTs) in a display panel in a second period of each scanning cycle; and controlling, by the driving control unit, the driving signal output unit to output a second gate driving signal which is configured to turn off the TFTs in the display panel by using a storage capacitor across which a voltage difference is within a predetermined range in a third period of each scanning cycle.

The gate driving method may further include: maintaining, by a compensating unit, the voltage difference across the storage capacitor to be within the predetermined range in the third period of each scanning cycle.

Figure 7:
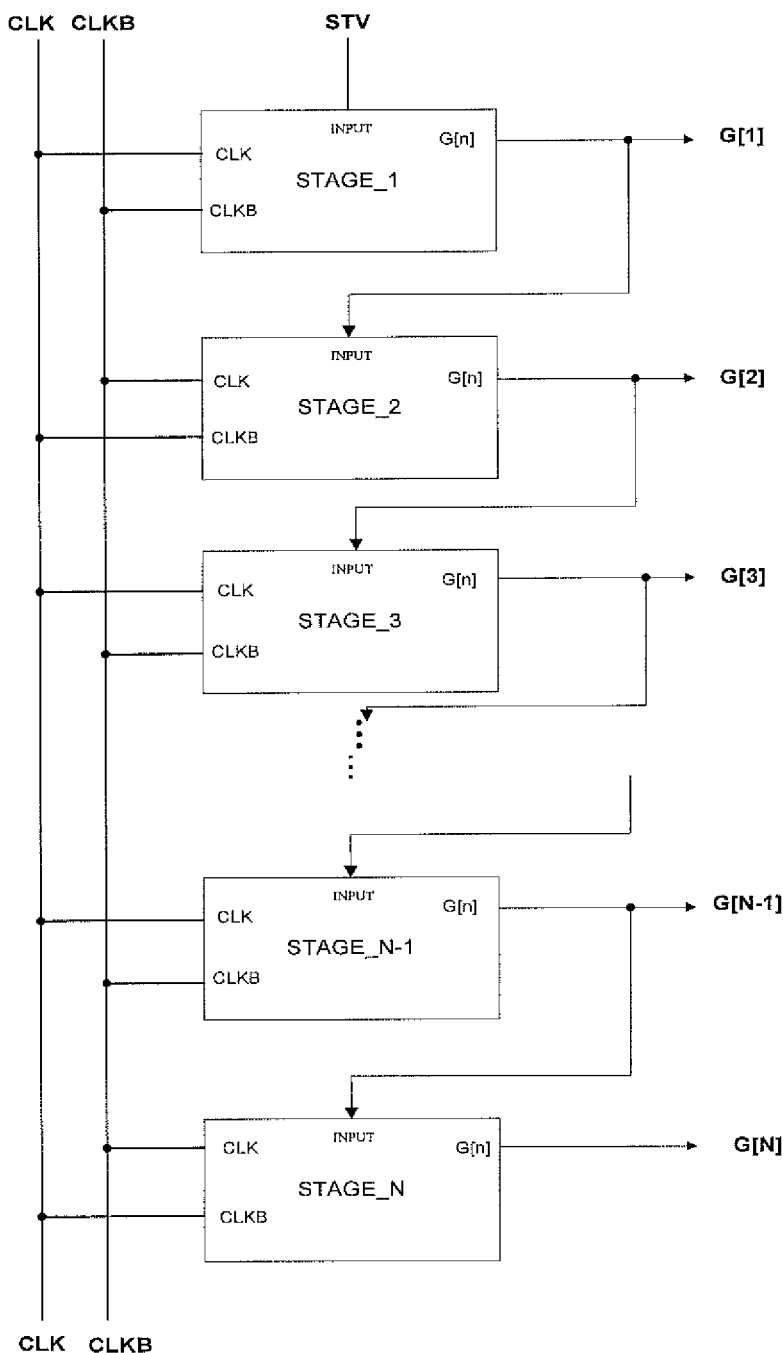
FIG. 7 is a block diagram showing a structure of a Gate Driver on Array (GOA) according to an embodiment of the present disclosure.

As shown in FIG. 7, the present disclosure further provides in an embodiment a Gate Driver on Array (GOA), which includes multi-level gate driving circuits described above.

Except for a first level gate driving circuit, an input end of each of the multi-level gate driving circuits which is configured to receive an input signal is connected to a gate driving signal output end of an immediately previous level gate driving circuit.

An input end INPUT of a first level gate driving circuit STAGE_1 is inputted with a start signal STV.

In FIG. 7, STAGE_1 represents a first level gate driving circuit, STAGE_2 represents a second level gate driving circuit, STAGE_3 represents a third level gate driving circuit, STAGE_N represents an $N^{th}$ level gate driving circuit, and STAGE_N−1 represents an $(N-1)^{th}$ level gate driving circuit, where N is an integer greater than 4. G[1] is a gate driving signal output end of STAGE_1, G[2] is a gate driving signal output end of STAGE_2, G[3] is a gate driving signal output end of STAGE_3, G[N−1] is a gate driving signal output end of STAGE N−1, and G[N] is a gate driving signal output end of STAGE_$_N$.

The present disclosure further provides in an embodiment a display device, including the above GOA.

Alternatively, the display device is an Active-Matrix Organic Light Emitting Diode (AMOLED) display device.

The above description of the present disclosure is merely illustrative, but not restrictive. A person skilled in the art will appreciate that without departing from the spirit and scope defined by the appended claims, many modifications, changes or equivalents may be made, all of which will fall within the protect scope of the present disclosure.

What is claimed is:
1. A gate driving circuit comprising:
 a driving signal output circuit provided with a storage capacitor;
 a driving control circuit connected to the driving signal output circuit via a first node and a second node, and configured to sample an input signal in a first period of each scanning cycle, control the driving signal output circuit to output a first gate driving signal which is configured to turn on thin film transistors (TFTs) in a display panel in a second period of each scanning cycle, and control the driving signal output circuit to output a second gate driving signal which is configured to turn off the TFTs in the display panel by using the storage capacitor across which a voltage difference is within a predetermined range in a third period of each scanning cycle, wherein the first gate driving signal and the second gate driving signal are outputted by a gate driving signal output end; and the storage capacitor is connected between the first node and the gate driving signal output end; and
 a compensating circuit configured to maintain the voltage difference across the storage capacitor to be within the predetermined range in the third period of each scanning cycle,
 wherein the compensating circuit comprises:
 a first compensating transistor, a gate electrode of which is inputted with a control signal, and a first electrode of which is connected to the gate driving signal output end; and
 a second compensating transistor, a gate electrode of which is connected to the gate driving signal output end, a first electrode of which is connected to a second electrode of the first compensating transistor, and a second electrode of which is connected to the first node.
2. The gate driving circuit according to claim 1, wherein the driving signal output circuit further comprises:
 a first output transistor, a gate electrode of which is connected to the first node, a first electrode of which is connected to a first signal output end, and a second electrode of which is connected to the gate driving signal output end; and a second output transistor, a gate electrode of which is connected to the second node, a first electrode of which is connected to the gate driving signal output end, and a second electrode of which is connected to a second signal output end.

3. The gate driving circuit according to claim 2, further comprising:

a potential maintaining capacitor, connected between the second node and the second signal output end, and configured to maintain a potential of the second node in the third period of each scanning cycle.

4. The gate driving circuit according to claim 2, wherein both the first output transistor and the second output transistor are P-type thin film transistors (TFTs).

5. The gate driving circuit according to claim 1, wherein the control signal controls the first compensating transistor to be turned on in the third period of each scanning cycle.

6. The gate driving circuit according to claim 1, wherein the control signal controls the first compensating transistor to be turned on at a predetermined interval in the third period of each scanning cycle.

7. The gate driving circuit according to claim 1, wherein the driving control circuit comprises:

an input transistor, a gate electrode of which is inputted with a first clock signal, a first electrode of which is inputted with the input signal, and a second electrode of which is connected to the first node;

a first driving control transistor, a gate electrode and a first electrode of which are inputted with the first clock signal, and a second electrode of which is connected to the second node; and a second driving control transistor, a gate electrode of which is connected to the first node, a first electrode of which is connected to the second node, and a second electrode of which is inputted with the first clock signal.

8. A gate driving method, which is applied in a gate driving circuit, comprising:

a driving signal output circuit provided with a storage capacitor;

a driving control circuit connected to the driving signal output circuit via a first node and a second node, and configured to sample an input signal in a first period of each scanning cycle, control the driving signal output circuit to output a first gate driving signal which is configured to turn on thin film transistors (TFTs) in a display panel in a second period of each scanning cycle, and control the driving signal output circuit to output a second gate driving signal which is configured to turn off the TFTs in the display panel by using the storage capacitor across which a voltage difference is within a predetermined range in a third period of each scanning cycle, wherein the first gate driving signal and the second gate driving signal are outputted by a gate driving signal output end; and the storage capacitor is connected between the first node and the gate driving signal output end; and a compensating circuit configured to maintain the voltage difference across the storage capacitor to be within the predetermined range in the third period of each scanning cycle, wherein the compensating circuit comprises:

a first compensating transistor, a gate electrode of which is inputted with a control signal, and a first electrode of which is connected to the gate driving signal output end; and a second compensating transistor, a gate electrode of which is connected to the gate driving signal output end, a first electrode of which is connected to a second electrode of the first compensating transistor, and a second electrode of which is connected to the first node, the gate driving method comprising: sampling, by the driving control circuit, an input signal in a first period of each scanning cycle; controlling, by the driving control circuit, a driving signal output circuit to output a first gate driving signal which is configured to turn on thin film transistors (TFTs) in a display panel in a second period of each scanning cycle; and controlling, by the driving control circuit, the driving signal output circuit to output a second gate driving signal which is configured to turn off the TFTs in the display panel by using the storage capacitor across which a voltage difference is within a predetermined range in a third period of each scanning cycle; and wherein the gate driving method further comprises:

maintaining, by the compensating circuit, the voltage difference across the storage capacitor to be within the predetermined range in the third period of each scanning cycle.

9. A gate driver on array (GOA) comprising multi-level gate driving circuits;

wherein each of the multi-level gate driving circuits comprises:

a driving signal output circuit provided with a storage capacitor;

a driving control circuit connected to the driving signal output circuit via a first node and a second node, and configured to sample an input signal in a first period of each scanning cycle, control the driving signal output circuit to output a first gate driving signal which is configured to turn on thin film transistors (TFTs) in a display panel in a second period of each scanning cycle, and control the driving signal output circuit to output a second gate driving signal which is configured to turn off the TFTs in the display panel by using the storage capacitor across which a voltage difference is within a predetermined range in a third period of each scanning cycle, wherein the first gate driving signal and the second gate driving signal are outputted by a gate driving signal output end; and the storage capacitor is connected between the first node and the gate driving signal output end; and a compensating circuit configured to maintain the voltage difference across the storage capacitor to be within the predetermined range in the third period of each scanning cycle, wherein the compensating circuit comprises:

a first compensating transistor, a gate electrode of which is inputted with a control signal, and a first electrode of which is connected to the gate driving signal output end; and a second compensating transistor, a gate electrode of which is connected to the gate driving signal output end, a first electrode of which is connected to a second electrode of the first compensating transistor, and a second electrode of which is connected to the first node, wherein except for a first level gate driving circuit, an input end of each of the multi-level gate driving circuits which is configured to receive an input signal is connected to a gate driving signal output end of an immediately previous level gate driving circuit.

10. A display device, comprising the gate driver on array (GOA) according to claim 9.

11. The display device according to claim 10, wherein the display device is an active matrix organic light emitting diode (AMOLED) display device.

12. The GOA according to claim 9, wherein the driving signal output circuit further comprises:
   a first output transistor, a gate electrode of which is connected to the first node, a first electrode of which is connected to a first signal output end, and a second electrode of which is connected to the gate driving signal output end; and
   a second output transistor, a gate electrode of which is connected to the second node, a first electrode of which is connected to the gate driving signal output end, and a second electrode of which is connected to a second signal output end.

13. The GOA according to claim 9, wherein the control signal controls the first compensating transistor to be turned on in the third period of each scanning cycle.

14. The GOA according to claim 9, wherein the control signal controls the first compensating transistor to be turned on at a predetermined interval in the third period of each scanning cycle.

15. The GOA according to claim 9, wherein the driving control circuit comprises:
   an input transistor, a gate electrode of which is inputted with a first clock signal, a first electrode of which is inputted with the input signal, and a second electrode of which is connected to the first node;
   a first driving control transistor, a gate electrode and a first electrode of which are inputted with the first clock signal, and a second electrode of which is connected to the second node; and
   a second driving control transistor, a gate electrode of which is connected to the first node, a first electrode of which is connected to the second node, and a second electrode of which is inputted with the first clock signal.

16. The GOA according to claim 9, wherein each of the multi-level gate driving circuits further comprises:
   a potential maintaining capacitor, connected between the second node and the second signal output end, and configured to maintain a potential of the second node in the third period of each scanning cycle.

* * * * *